United States Patent [19]
Dagens et al.

[11] Patent Number: 6,128,425
[45] Date of Patent: Oct. 3, 2000

[54] SEMICONDUCTOR OPTICAL AMPLIFIER DEVICE

[75] Inventors: Béatrice Dagens, Paris; Christopher Janz, Issy-les-Moulineaux, both of France

[73] Assignee: Alcatel, Paris, France

[21] Appl. No.: 09/143,656

[22] Filed: Aug. 31, 1998

[30] Foreign Application Priority Data

Sep. 1, 1997 [FR] France .................................. 97 10843

[51] Int. Cl.[7] ....................................... G02B 6/26
[52] U.S. Cl. .................... 385/14; 385/45; 385/37
[58] Field of Search ................. 385/45, 50, 14, 385/22, 37

[56] References Cited

U.S. PATENT DOCUMENTS

| 5,121,450 | 6/1992 | Eichen et al. | 385/45 |
| 5,233,453 | 8/1993 | Sivarajaan et al. | 385/14 |
| 5,305,412 | 4/1994 | Paoli | 385/122 |
| 5,640,474 | 6/1997 | Tayag | 385/43 |
| 5,802,222 | 9/1998 | Rasch et al. | 385/45 |
| 5,832,155 | 11/1998 | Rasch et al. | 385/45 |

FOREIGN PATENT DOCUMENTS 0 639 876 A1  2/1995  European Pat. Off. .

OTHER PUBLICATIONS

Patent Abstracts of Japan, vol. 016, No. 341 (P–1391) Jul. 23, 1992 corresponding to JP 04 102834 A (Mitsubishi Electric Corp) Apr. 3, 1992.
J. M. Heaton et al, "Novel 1–to–N Way Integrated Optical Beam Splitters Using Symmetric Mode Mixing in GAAS/ALGAAS Multimode Waveguides", Applied Physics Letters, vol. 61, No. 15, Oct. 12, 1992, pp. 1754–1756.

*Primary Examiner*—Hung N. Ngo
*Attorney, Agent, or Firm*—Sughrue, Mion, Zinn, Macpaek & Seas, PLLC

[57] ABSTRACT

To increase its saturation threshold very strongly without degrading its gain, whilst remaining compatible with any semiconductor amplifier structure or technology, a semiconductor optical amplifier includes an input coupler having an input port and g output ports and an output coupler having g input ports and one output port. The q output ports of the input coupler are respectively connected to the q input ports of the output coupler by q semiconductor optical amplifiers having the same amplification characteristics. Applications include transmission of optical signals and to producing "all optical" switching devices.

6 Claims, 3 Drawing Sheets

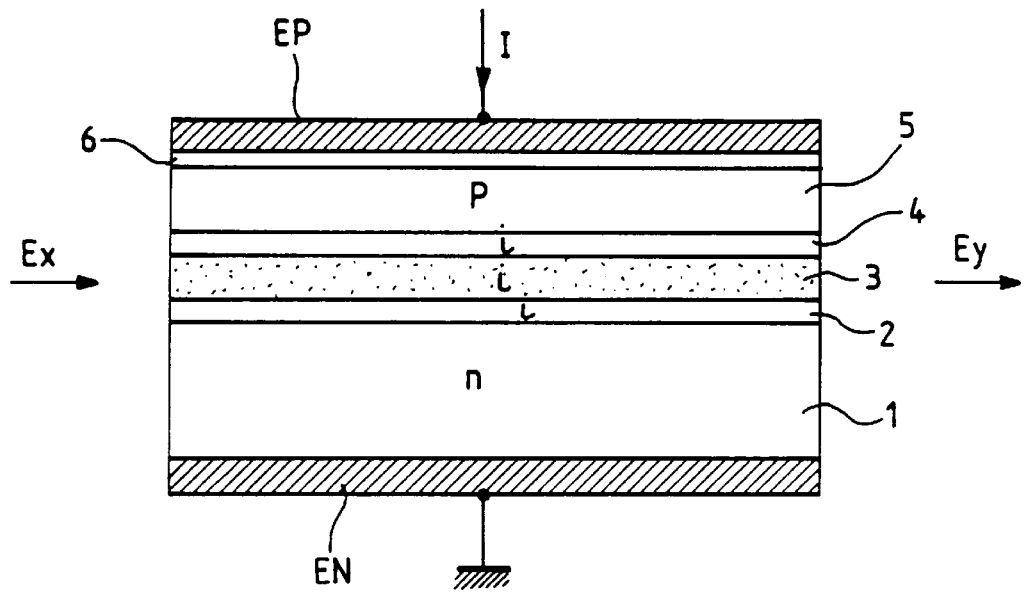
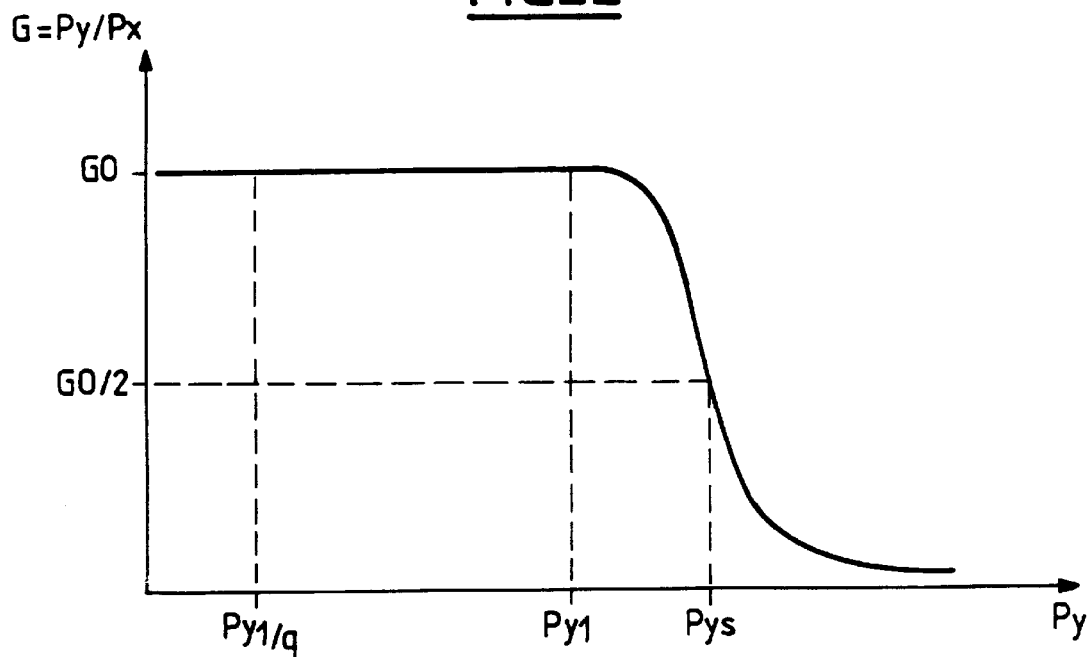

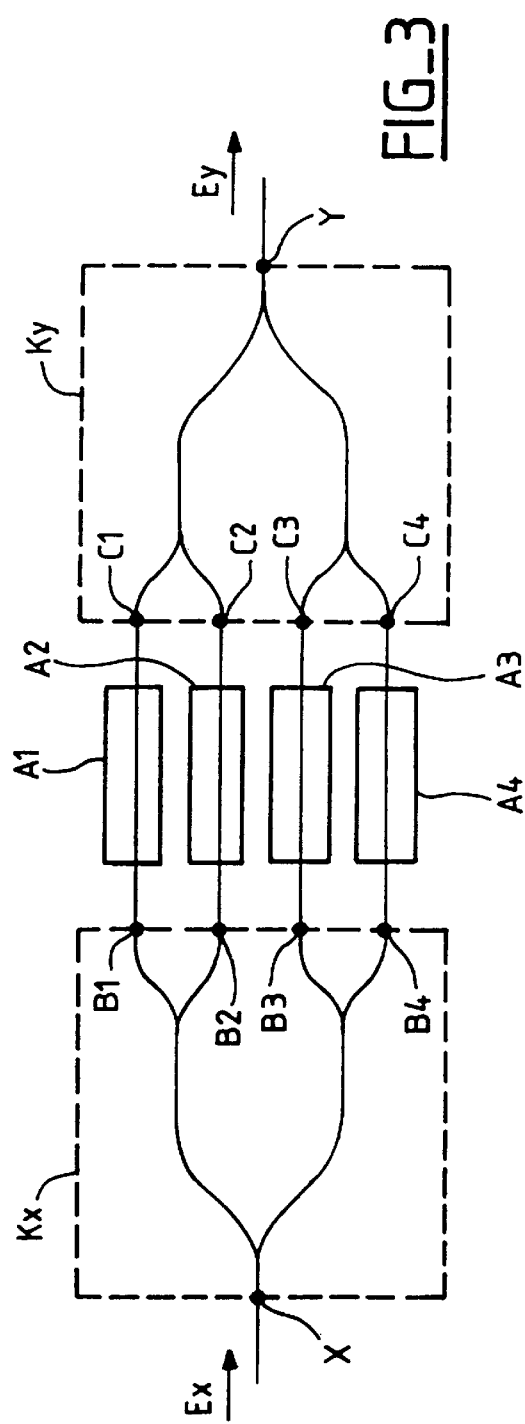
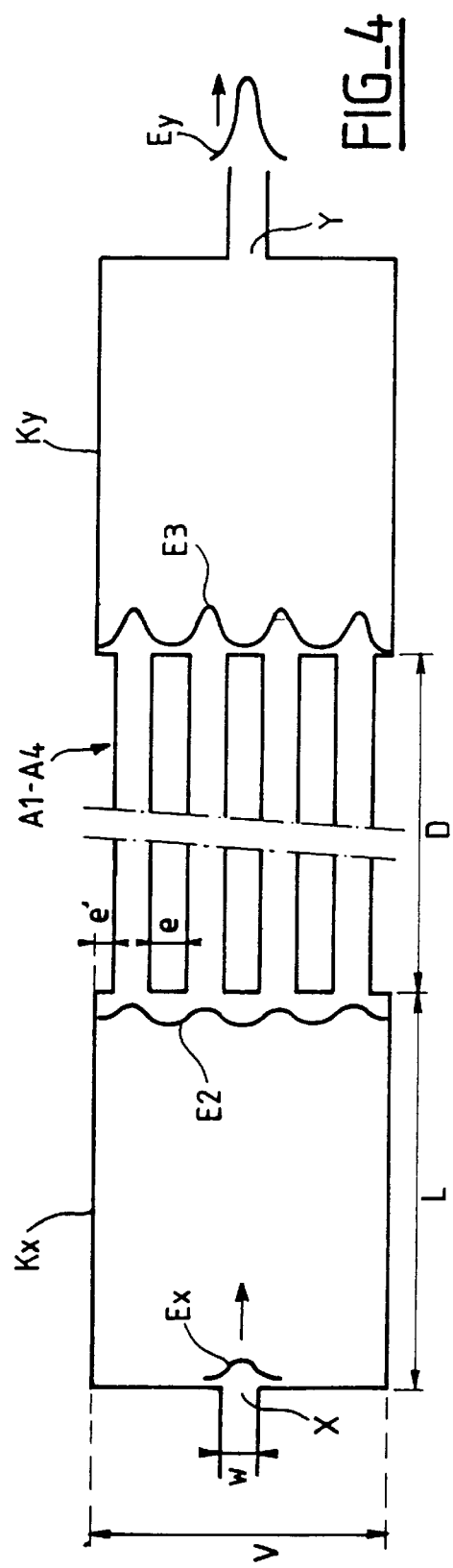

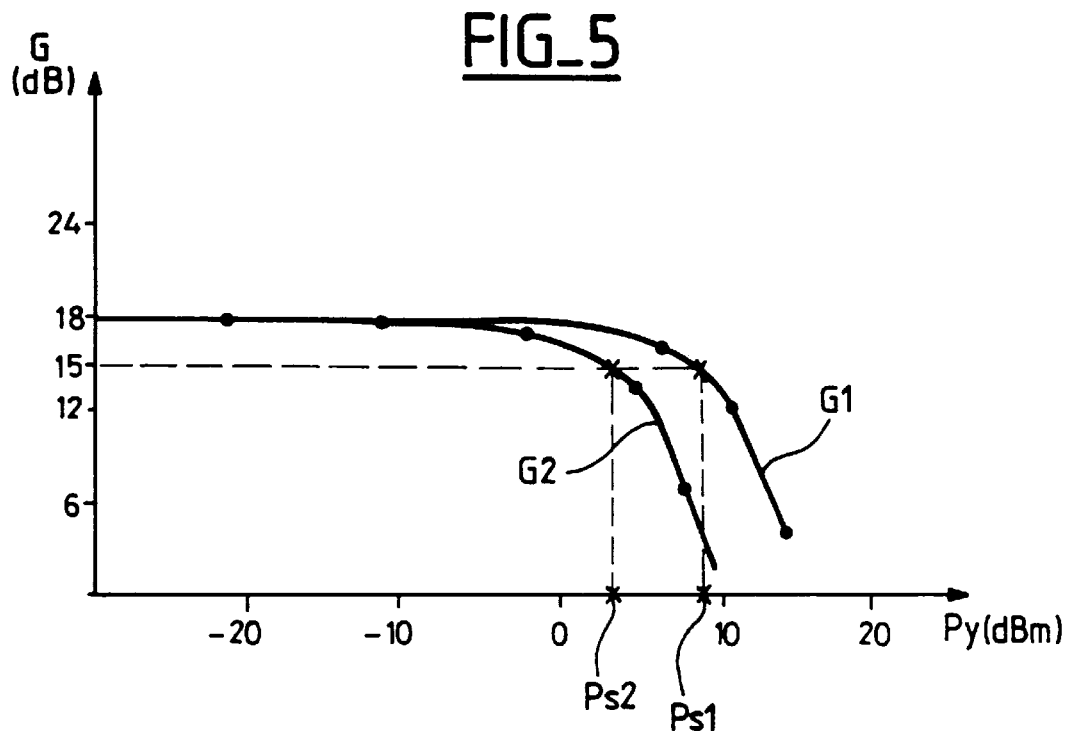
FIG_5
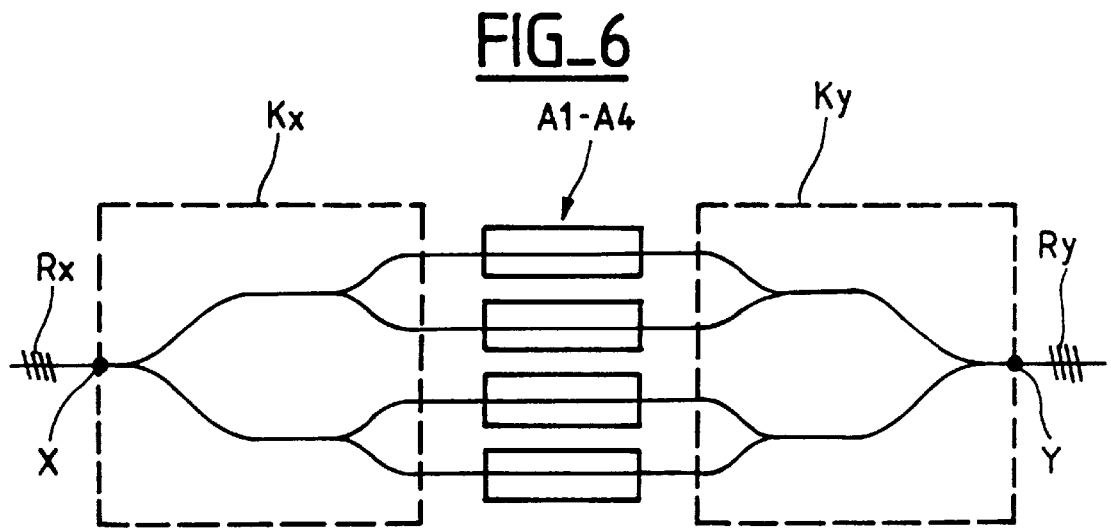
FIG_6

SEMICONDUCTOR OPTICAL AMPLIFIER DEVICE

BACKGROUND OF THE INVENTION

1. Field of the Invention

The invention concerns optical amplifiers and more particularly semiconductor optical amplifiers.

2. Description of the Prior Art

Optical amplifiers are routinely used for the transmission of optical signals and for producing "all optical" switching devices.

The essential characteristic of an optical amplifier is its gain, which is defined as the ratio of the optical power that it provides at the output to the optical power that it receives at the input. For low optical powers the gain is constant and the amplifier operates in a linear manner. On the other hand, from a particular level of applied power the value of the gain decreases as the power increases. Accordingly, another characteristic of an amplifier is its output threshold power, which is defined as the output power for which the gain has a value equal to half the gain of the amplifier when the latter is not saturated (unsaturated gain).

Saturation is particularly significant in the case of semiconductor optical amplifiers. The saturation power of the amplifier must be as high as possible for applications requiring linear operation and high power.

One solution to this problem is to optimize the dimensions of the component and the composition of the semiconductor layer that constitutes it or to adopt complex active structures such as multiple quantum wells. For example, widening the guide part of the active layer reduces the power density so the threshold can be raised. However, this solution is limited by the fact that the guide of the amplifier is usually required to have a monomode structure.

Another solution is to use a stabilized gain amplifier as described in European patent application EP-A-639876 published Feb. 22, 1995, for example. This solution extends the range of linear operation of the amplifier but in a limited fashion and to the detriment of the useable gain.

The aim of the invention is to avoid the limitations of the methods referred to hereinabove. To this end the present invention proposes a solution that raises the saturation threshold very strongly without degrading the gain whilst remaining compatible with any semiconductor amplifier structure or technology.

SUMMARY OF THE INVENTION

To be more precise, the invention consists of a semiconductor optical amplifier device including an input coupler having at least a first input port and at least q first output ports, the input coupler being adapted to convert an input optical wave applied to the first input port into q secondary optical waves respectively focused on the q first output ports and each having an optical power proportional to the power of the input wave, and an output coupler having at least q second input ports and at least one second output port, the second output coupler being adapted to convert q secondary waves respectively applied to the g second input ports into an output optical wave focused on the second output port and having the same modal characteristics as the input wave, wherein the q first output ports of the input coupler are respectively connected to the q second input ports of the output coupler by q optical amplifiers having the same amplification characteristics.

Compared to a conventional amplifier having the same unsaturated gain, the device of the invention can, in theory, achieve a saturation power that is q times higher.

In one preferred embodiment that assures a compact device the input and/or output couplers are multimode guides.

In another embodiment the device is implemented in the form of an integrated component, for example on an indium phosphide substrate. An integrated implementation has the advantage of minimum losses and homogeneous optical and electrical characteristics of the guides of the amplifiers.

The compactness of multimode guides further authorizes a simplified integrated implementation known as an "all active" implementation, i.e. one in which the vertical structures of the guide parts are identical throughout the component. The input and output couplers are then biased for transparency and therefore operate as amplifiers but the multimode guide is sufficiently short to limit saturation at the output port of the output coupler.

In accordance with another aspect of the invention the device is adapted to operate as a stabilized gain amplifier. To this end it includes two wavelength-selective reflectors respectively coupled to the input port of the input coupler and to the output port of the output coupler to form a resonant cavity adapted to sustain gain stabilizing oscillation.

Other aspects and advantages will become apparent in the course of the description referring to the figures.

BRIEF DESCRIPTION OF THE DRAWINGS

FIG. 1 shows one example of a vertical structure of a semiconductor optical amplifier.

FIG. 2 shows the gain characteristic of a semiconductor amplifier.

FIG. 3 shows a first embodiment of the device of the invention.

FIG. 4 shows a second embodiment of the device of the invention.

FIG. 5 shows gain curves of the device of the invention and of a standard semiconductor amplifier.

FIG. 6 shows a stabilized gain amplifier device of the invention.

DETAILED DESCRIPTION OF THE PREFERRED EMBODIMENTS

FIG. 1 shows a longitudinal section at the level of the active guide layer of one example of a prior art semiconductor optical amplifier structure. This structure can be used to implement the invention. The amplifier can be made on a III–V element substrate. By way of non-limiting example, an indium phosphide InP substrate and a buried guide structure have been chosen.

The InP substrate 1, which has an index equal to 3.17, is n-doped and the following are formed on it in succession:

- an undoped InGaAsP quaternary bottom confinement layer 2, the composition of which is chosen to have an index equal to 3.32 and a characteristic wavelength ("gap" wavelength) equal to 1.18 $\mu$m,
- an undoped quaternary layer 3 the composition of which is chosen to have an index equal to 3.51 and a characteristic wavelength equal to 1.55 $\mu$m,
- an undoped InGaAsP quaternary top confinement layer 4 the composition of which is chosen to have an index equal to 3.32 and a characteristic wavelength equal to 1.18 $\mu$m,
- a p-doped indium phosphide layer 5, and
- a strongly p-doped InGaAs ternary contact layer 6.

The width of the buried active guide is 1.2 μm, for example, to assure monomode operation at the usual wavelengths employed in optical communications.

Top and bottom electrodes EP and EN are used to inject an electric pump current I vertically into the structure.

The amplifier receives via one of its faces a power modulated wave input Ex and supplies an amplified output wave Ey via the opposite face. The input and output faces are usually produced by cleaving a semiconductor wafer that incorporates a plurality of amplifiers, after which these faces receive an anti-reflection treatment.

FIG. 2 is a diagram showing the gain characteristic of the structure. The gain G=Py/Px varies as a function of the output optical power Py in accordance with the curve shown, Px and Py being the optical power of the input wave Ex and the output wave Ey, respectively. For low values of Py the gain G has a practically constant value G0 called the "unsaturated gain". If the input power Px increases the output power Py increases but beyond a particular value saturation occurs and the gain decreases in a regular manner. In practise an output saturation power Pys is defined for which the gain is equal to half the unsaturated gain G0. For linear operation of the amplifier the output power Py must at all times remain below the saturation power Pys.

FIG. 3 shows a first example of a device in accordance with the invention. It includes an input coupler Kx having an input port X and plurality of output ports B1–B4. In the example shown there are four output ports but in the general case there can be any number q of ports. The device further includes an output coupler Ky with q input ports C1–C4 and an output port Y. The output ports B1–B4 are connected to the input ports C1–C4 by q semiconductor optical amplifiers A1–A4 having the same amplification characteristics.

The input coupler Kx converts the input optical wave Ex applied to the input port X into q secondary optical waves respectively focused on the q output ports B1–B4. Each secondary wave has an optical power proportional to the power Px of the input wave Ex. To a first approximation, ignoring losses, this power is equal to Px/q.

The output coupler Ky performs the inverse transformation.

One possible implementation uses "1 to q" and "q to 1" couplers with identical structures based on "Y" couplers in cascade, for example, as shown diagrammatically in FIG. 3.

Ignoring coupling losses, each amplifier A1–A4 of gain G receives the power Px/q of one secondary optical wave and supplies the power G.Px/q to one of the q input ports C1–C4 of the output coupler Ky. The latter delivers the power G.Px at its output port Y.

To show the benefit of the device with regard to the saturation problem, FIG. 2 compares its operation to that of a conventional semiconductor amplifier serving as a reference. It is assumed that the device of the invention and the reference amplifier use the same technology and the same guide structures and have the same unsaturated gain G0, i.e. that each amplifier A1–A4 is identical to the reference amplifier.

If in both cases an input power Px1 corresponding to an output power Py1 below the output saturation Pys of the reference amplifier (FIG. 2) is applied, in the case of the invention the input power of each amplifier is equal to Px1/q and its output power is therefore q times lower than that of the reference amplifier. As a result the invention maintains linear operation for a power q times higher than in the case of the reference amplifier.

In the FIG. 3 implementation the input and output couplers use Y couplers which have some drawbacks, however.

To limit coupler losses the guides that constitute them must not be highly curved. This imposes a minimal length on each coupler, for example in the order of 100 μm. In practise these lengths rule out the "all active" implementation previously referred to.

Another constraint is the fact that the guides of the coupler must follow very precise paths so as not to introduce any imbalance between the different optical paths taken by the waves.

To solve the problem of the overall size of the couplers, combined with low losses, it is better to use multimode guides to implement the couplers. Couplers of this type are known as multimode interference couplers or beam splitters. A detailed description of them can be found in: "Novel 1-to-N way integrated optical beam splitters using symmetric mode mixing in GaAs/AlGaAs multimode waveguides", J. M. Heaton et al, Applied Physics Letters, vol. 61, N° 15, Oct. 12, 1992, for example.

FIG. 4 is a diagrammatic plan view of an amplifier device using multimode couplers for the input and output couplers Kx, Ky.

As shown, the input wave Ex applied to the input X of the multimode coupler Kx is converted into a multimode wave E2 which, by virtue of appropriate dimensioning of the coupler, has optical power maxima at its output ports. These maxima are guided and amplified in the amplifier guides A1–A4 and then applied to the respective input ports of the multimode output coupler Ky. There forms at this point an amplified multimode wave E3 which is subject to the inverse transformation to that applied to the input wave Ex in the coupler Kx. The output port Y of the coupler Ky delivers the output wave Ey.

One particular embodiment using multimode couplers with an all active structure as shown in FIG. 1 will now be described by way of illustration and for the situation in which q=4.

All the guides coupled to the inputs and to the outputs of the couplers Kx, Ky are monomode guides and have the same width w=1.2 μm. Accordingly:

length of multimode guides: L=54.75 μm width of multimode guides: V=9.6 μm length of each amplifier guide: D=270.5 μm spacing between amplifier guides: e=1.2 μm distance between lateral edges of multimode guides and outside edges of end amplifier guides: e'=0.6 μm.

By way of comparison, FIG. 5 shows the gain curves G1 and G2 calculated by simulation respectively for the amplifier device of FIG. 4 dimensioned as previously indicated and for a conventional amplifier using the same technology and having the same unsaturated gain. The gains G1, G2 are expressed in decibels and the output power is expressed in dBm (10 times the logarithm to base 10 of the optical power expressed in milliwatts).

These simulation curves show that there is a difference of approximately 6 dB between the saturation power Ps1 of the device of the invention and that Ps2 of the reference amplifier.

Another important aspect of semiconductor amplifiers is noise. The signal to noise ratio at the output of a semiconductor amplifier is degraded when it is used at low powers. This is because the noise is due largely to amplified spontaneous emission (ASE), which increases as the input optical power decreases.

In the case of the device of the invention, for a given input power Px, each of the amplifiers A1–A4 receives a power q times lower than the reference amplifier. Each amplifier therefore delivers an output signal with a degraded signal to noise ratio. However, ignoring losses, the power of the output signal is q times the output power of each amplifier because the output wave is the result of constructive interference between the waves from the amplifiers. On the other hand, the noise created by the various amplifiers is not coherent and when combined in the output multimode guide the resulting power can be less than the sum of the noise powers of the amplifiers. Moreover, if the device is used for power levels sufficient for each amplifier to operate in the linear region near its saturation threshold, it is even possible to improve the signal to noise ratio compared to the reference amplifier.

FIG. 6 shows a stabilized gain amplifier device of the invention. The basic amplifying structure is the same as previously but two reflectors Rx and Ry have been added, respectively coupled to the input port X and to the output port Y. The reflectors Rx and Ry are Bragg gratings, for example, dimensioned to reflect a wavelength attributed to a gain stabilizing oscillation, this wavelength being different to those of the waves to be amplified. Also, the amplifier is dimensioned to sustain this oscillation.

The theory of operation of the stabilized gain amplifier device of the invention is the same as that of the stabilized gain amplifier in the previously mentioned European patent application EP-A-639876.

The embodiments of the invention that have just been described are all totally symmetrical, which simplifies dimensioning and fabrication. It should nevertheless be noted that the invention could use non-symmetrical devices, for example an input coupler having a number of output ports greater than the number of amplifiers. In this case it is necessary to dimension the output coupler accordingly so that it reconstructs an output wave having the same modal characteristics as the input wave.

What is claimed is:

1. A semiconductor optical amplifier device comprising:

an input coupler having at least a first input port and at least q first output ports, said input coupler being adapted to convert an input optical wave applied to said first input port into q secondary optical waves respectively focused on said q first output ports and each having an optical power proportional to the power of said input wave; and an output coupler having at least q second input ports and at least one second output port, said second output coupler being adapted to convert q secondary waves respectively applied to said q second input ports into an output optical wave focused on said second output port and having the same modal characteristics as said input wave, wherein said q first output ports of said input coupler are respectively connected to said q second input ports of said output coupler by q optical amplifiers having the same amplification characteristics and wherein said input or output couplers are multimode guides.

2. A device as claimed in claim 1 implemented in the form of an integrated component.

3. A device as claimed in claim 2 integrated on an indium phosphide substrate.

4. The device claimed in claim 1 wherein said input and output couplers have vertical structures identical to those of said amplifiers.

5. The device claimed in claim 1 wherein said amplifiers have identical structures.

6. A semiconductor optical amplifier device comprising:

an input coupler having at least a first input port and at least q first output ports, said input coupler being adapted to convert an input optical wave applied to said first input port into q secondary optical waves respectively focused on said q first output ports and each having an optical power proportional to the power of said input wave;

an output coupler having at least q second input ports and at least one second output port, said second output coupler being adapted to convert q secondary waves respectively applied to said q second input ports into an output optical wave focused on said second output port and having the same modal characteristics as said input wave; and two wavelength-selective reflectors respectively connected to said first input port and to said second output port to form a resonant cavity and to sustain optical gain stabilizing oscillation, wherein said q first output ports of said input coupler are respectively connected to said q second input ports of said output coupler by q optical amplifiers having the same amplification characteristics.

* * * * *